(12) United States Patent
Fujii (10) Patent No.: US 8,543,235 B2
(45) Date of Patent: Sep. 24, 2013

(54) METHOD OF CONTROLLING TRANSFER ROBOT

(75) Inventor: Yoshinori Fujii, Susono (JP)

(73) Assignee: Ulvac, Inc., Kanagawa (JP)

( * ) Notice: Subject to any disclaimer, the term of this patent is extended or adjusted under 35 U.S.C. 154(b) by 176 days.

(21) Appl. No.: 13/054,818

(22) PCT Filed: Jul. 23, 2009

(86) PCT No.: PCT/JP2009/003486
§ 371 (c)(1),
(2), (4) Date: Feb. 8, 2011

(87) PCT Pub. No.: WO2010/013422
PCT Pub. Date: Feb. 4, 2010

(65) Prior Publication Data
US 2011/0130858 A1 Jun. 2, 2011

(30) Foreign Application Priority Data

Aug. 1, 2008 (JP) .................................. 2008-199675

(51) Int. Cl.
*G06F 19/00* (2011.01)
(52) U.S. Cl.
USPC ......................................... 700/112; 700/300
(58) Field of Classification Search
USPC ..................................... 700/112, 300; 901/2
See application file for complete search history.

(56) References Cited

U.S. PATENT DOCUMENTS

| 6,132,165 | A | 10/2000 | Carducci |
| 6,246,923 | B1 | 6/2001 | Sugimura et al. |
| 2006/0291988 | A1 | 12/2006 | Machiyama et al. |

FOREIGN PATENT DOCUMENTS

| JP | 62-027234 A | 2/1987 |
| JP | 2002-503561 A | 2/2002 |
| JP | 2004-235538 A | 8/2004 |
| JP | 2004-268151 A | 9/2004 |
| JP | 2007-291530 A | 11/2007 |
| JP | 2008-147631 A | 6/2008 |
| WO | WO97/34742 A1 | 9/1997 |

OTHER PUBLICATIONS

Search Report and Written Opinion from Singapore Patent App. 201100402-5 (Jan. 31, 2012).
International Search Report for PCT Patent App. No. PCT/JP2009/003486 (Sep. 8, 2009).

*Primary Examiner* — Carlos Ortiz Rodriguez
(74) *Attorney, Agent, or Firm* — Cermak Nakajima LLP; Tomoko Nakajima (57) ABSTRACT

A method of controlling a transfer robot is provided, in which method the communication time of the transfer robot can be reduced and the transfer time of a substrate can be shortened. A series of actions of the transfer robot when a substrate that is present in a processing chamber is transferred to a predetermined position in a processing chamber, are performed by a single command. The series of actions may include a swap action in which, after having taken out by a robot hand the substrate that is present in the processing chamber, a substrate that is different from the substrate is handed over by a robot hand to a predetermined position on the processing chamber.

8 Claims, 5 Drawing Sheets

| Step | Up/Down | Turn | Hand12a Extension/Contraction | Hand12a Substrate Yes/No | Hand12b Extension/Contraction | Hand12b Substrate Yes/No |
|---|---|---|---|---|---|---|
| 1 | Up | | Contraction | Yes | Contraction | Yes |
| 2 | Up | Turn | Contraction | Yes | Contraction | Yes |
| 3 | Down | | Extension | No | Contraction | Yes |
| 4 | Down | | Contraction | No | Contraction | Yes |
| 5 | Down | Turn | Contraction | No | Contraction | Yes |
| 6 | Down | | Extension | Yes | Contraction | Yes |
| 7 | Up | | Contraction | Yes | Contraction | Yes |
| 8 | Up | Turn | Contraction | Yes | Contraction | Yes |
| 9 | Up | | Contraction | Yes | Extension | Yes |
| 10 | Down | | Contraction | Yes | Extension | No |

METHOD OF CONTROLLING TRANSFER ROBOT

This application is a national phase entry under 35 U.S.C. §371 of PCT Patent Application No. PCT/JP2009/003486, filed on Jul. 23, 2009, which claims priority under 35 U.S.C. §119 to Japanese Patent Application No. 2008-199675, filed Aug. 1, 2008, both of which are incorporated by reference.

TECHNICAL FIELD

The present invention relates to a method of controlling a transfer robot which is disposed in a processing apparatus.

BACKGROUND ART

Figure 1:
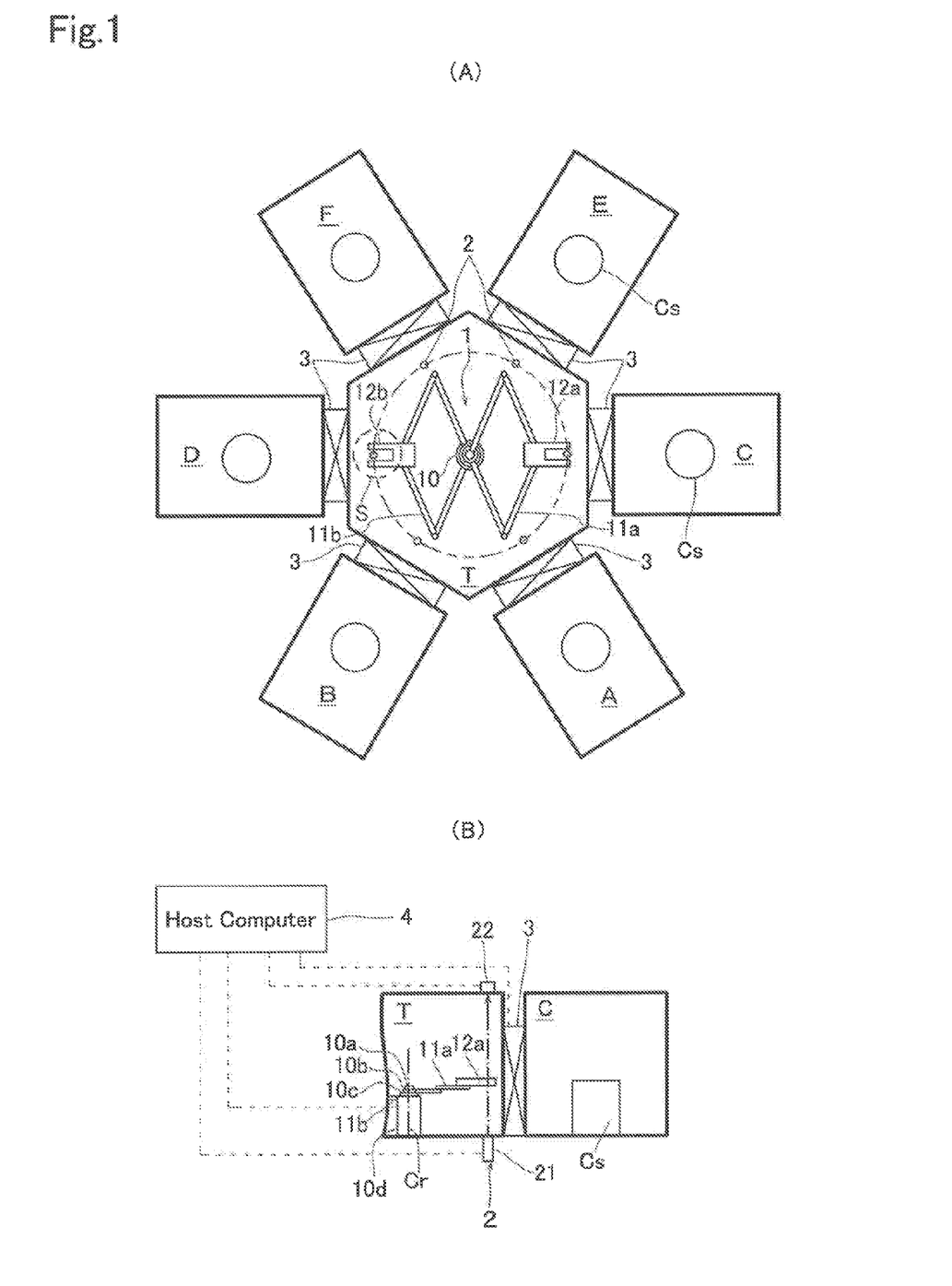
FIGS. 1(A) and 1(B) are plan view and sectional view, respectively, schematically showing a processing apparatus which is provided with a transfer robot.

As an apparatus for performing various processing operations on a substrate, such as a film-forming operation, an etching operation, and the like, there is conventionally known an apparatus (so-called cluster tool apparatus) in which: as shown in FIG. 1, a plurality of load lock chambers A, B and a plurality of processing chambers C through F are disposed so as to enclose a central transfer chamber T in which is disposed a transfer robot 1; and a substrate S charged or fed into the load lock chamber A, B is transferred to the processing chambers C through F or among the processing chambers C through F by the transfer robot 1.

In this kind of apparatus, it is known that the state for the transfer robot to wait for a substrate to finish processing operation (so-called processing rate controlling) and the state for the transfer robot to wait for the substrate to be transferred out of the processing chamber (so-called transfer rate controlling) have effects on the processing capacity (throughput) of the processing apparatus. If the arrangement of the processing apparatus becomes complicated, the above-mentioned processing rate controlling and the transfer rate controlling will occur at a plurality of places. When the substrate is continuously processed, the total sum of the transfer time and the processing time, when due attention is paid to each of the substrates, are said to be the maximum processing capacity of the processing apparatus.

In order to improve the processing capacity of the processing apparatus, like in the processing apparatus as shown in FIG. 1, it is known to use a transfer robot having two robot hands for supporting the substrates (see, e.g., patent document 1). By using two robot hands, the transfer rate controlling can be minimized.

In this kind of processing apparatus, the transfer robot performs a single action in accordance with a single command that is issued from a host computer. In other words, in case a substrate that is present in one processing chamber is transferred to another processing chamber, the transfer robot used to perform a plurality of actions in accordance with the commands such as "pick," "go to," "place" and the like. Whenever each of the actions of the transfer robot is finished, communication used to be made between the transfer robot and the host computer. Therefore, in the conventional method of controlling a transfer robot, the number of communication between the transfer robot and the host computer is large and the transfer time becomes longer by the time that is required for the communication. Therefore, there was a problem in that the throughput is lowered.

PRIOR ART DOCUMENT

Patent Document

Patent Document 1: JP-A-2007-291530 (FIG. 8)

SUMMARY OF THE INVENTION

Problems to be Solved by the Invention

In view of the above-mentioned points, this invention has a problem of providing a method of controlling a transfer robot in which the communication time of a transfer robot can be reduced and in which the transfer time of the substrate can be shortened.

Means for Solving the Problems

In order to solve the above problems, this invention is a method of controlling a transfer robot which is turned and telescopically moved on a same plane in a state in which a substrate to be processed (hereinafter referred to as a to-be-processed substrate) is supported by a robot hand so as to transfer the substrate among a plurality of processing chambers disposed in a turning direction of the transfer robot. The method comprises performing by a single command a series of actions of the transfer robot at a time of transferring the substrate present in one processing chamber to a predetermined position in another processing chamber.

According to this invention, a series of actions of the transfer robot at the time of transferring the substrate that is present in one processing chamber to a predetermined position in another processing chamber are performed not by a plurality of commands but by a single command. Therefore, as compared with an example in which the series of actions of the transfer robot are controlled by a plurality of commands, the communication time of the transfer robot can be reduced. As a result, the time of transferring the substrate can be shortened.

Preferably, the transfer robot has two robot hands disposed at a predetermined distance from each other in the turning direction of the transfer robot. There can be performed by the above-mentioned single command a swapping action in which, after taking out the substrate present in the said one processing chamber by means of one of the two robot hands, a substrate different from the substrate that was taken out is handed over by the other of the two robot hands to a predetermined position in the said one processing chamber.

In this invention, preferably, the transfer robot is controlled such that the telescopic action and the turning action of the transfer robot are locally synthesized before and after a switching point at which the telescopic action and the turning action of the transfer robot are switched to each other. According to this arrangement, it becomes unnecessary to stop the transfer robot at the switching point. Therefore, as compared with the case in which the transfer robot is stopped at the switching point, the time can be shortened for the transfer robot to get accelerated and decelerated. In combination with the reduction in the above-mentioned time of communication by the transfer robot, the time for transferring the substrate can further be shortened.

In this invention, preferably, the presence or absence of a substrate on the robot hand is detected during a series of actions of the transfer robot and, based on the results of the detection, operation is made of parts disposed in a transfer passage that is used in transferring the substrate present in said one of the processing chambers to said another processing chamber. According to this arrangement, even at the time of transferring the substrate that is present in one of the processing chambers to another processing chamber, the substrate can be transferred safely and surely.

As the above-mentioned parts, at least one of the following may be included, i.e.: an isolation valve which separates the processing chamber from a transfer chamber in which the transfer robot is disposed; a lift pin which is moved up and down when a substrate is handed over between the transfer robot and a substrate stage disposed in the processing chamber; and a shield which forms a protection wall in the processing chamber. In case the above-mentioned swapping action is performed by a single command, by closing the isolation valve after having handed over the substrate to one of the processing chambers, the processing of the substrate in the said one processing chamber can be started.

BRIEF DESCRIPTION OF THE DRAWINGS

FIGS. 2(A) through 2(J) are plan views showing a series of actions to be performed by a single command according to this embodiment.

EMBODIMENTS FOR CARRYING OUT THE INVENTION

A description will now be made of an embodiment in which this invention is applied to the processing apparatus as shown in FIG. 1. In the transfer chamber T of the processing apparatus, there is disposed the transfer robot 1 having a known construction. Also disposed in the transfer chamber T are detection means 2 which perform detecting actions of a substrate S in the neighborhood of connecting points between the transfer chamber T and each of load lock chambers A, B and the processing chambers C through F. The transfer chamber T and the load lock chambers A, B and each of the processing chambers C through F are partitioned or isolated by respective gate valves (isolation valves) 3. The isolation valves 3 are to prevent the gas and the pressure inside each of the processing chambers C through F from leaking into the transfer chamber T.

The load lock chambers A, B and each of the processing chambers C through F are each provided with a substrate stage Cs which performs receiving and handing over of the substrate S. Each of the processing chambers C through F is provided, where necessary, with a shield (not illustrated) which forms a protection wall. This protection wall has the function of an adhesion prevention plate which prevents the reaction byproducts from getting adhered to the wall surfaces of the processing chamber, or the function of preventing the dust from splashing and the light and electromagnetic waves from leaking from each of the processing chambers C through F into the transfer chamber T. In addition, various sensors and drive mechanisms which constitute the processing apparatus such as the transfer robot 1, the detection means 2, the isolation valve 3, and the like are connected to a host computer 4 that performs the control of the entire processing apparatus.

The articulated type of transfer robot 1 which is represented by a flog leg type of robot is provided with a plurality of robot arms 11 as operating parts, and motors 10 as drive means to drive each of the robot arms 11 in a manner to be capable of turning, extending and contracting (telescopically moveable), and capable of moving up and down.

As shown in FIG. 1(B), rotary shafts 10a, 10b, 10c, 10d of each of the motors 10 are coaxially disposed. The rotary shafts 10a, 10b have connected thereto the robot arm 11a in a manner to form a link mechanism, and the rotary shafts 10c, 10d have connected thereto the robot arm 11b in a manner to form a link mechanism. At the front ends of these robot arms 11a, 11b there are disposed robot hands 12a, 12b respectively which support the substrate S in a manner to be mounted thereon.

The robot hands 12a, 12b are disposed so as to have a distance from each other in the turning direction. By adequately controlling the rotating angles and the rotating directions of the rotary shafts 10a, 10b, the robot hand 12a becomes telescopic and capable of turning. Independent of this robot hand 12a, the robot hand 12b becomes telescopic and capable of turning by appropriately controlling the rotation angles and the directions of rotation of the rotary shafts 10c, 10d. Further, the robot hands 12a, 12b are moveable up and down by the control of motors (not illustrated).

In this embodiment, by means of the transfer robot 1, the substrate S charged into, e.g., the load lock chamber A is transferred to the processing chamber C, and the substrate S subjected to processing in the processing chamber C is transferred to the processing chamber E, and the substrate S subjected to processing in the processing chamber E is then returned to the load lock chamber A. Similarly, the substrate S charged into the load lock chamber B is returned to the load lock chamber B after having been sequentially subjected to processing in the processing chamber D and the processing chamber F, respectively.

As the detection means 2, there are used, e.g., an optical sensor having a known construction such as a laser sensor, an LED fiber sensor, and the like, or a visual sensor such as a CCD camera and the like. In this embodiment, a description will be made of an example in which a translucent laser sensor made up of a laser projector 21 and a photo detector 22 are used as the detection sensor 2. An opaque projector may also be used as the optical sensor.

A description will now be made of a method of controlling the transfer robot 1. The feature of the control method of the transfer robot 1 according to this invention lies in that a series of actions of the transfer robot are performed by a single command at the time of transferring a substrate present in one processing chamber to a predetermined position (e.g., a substrate stage Cs) in another processing chamber.

Figure 2:
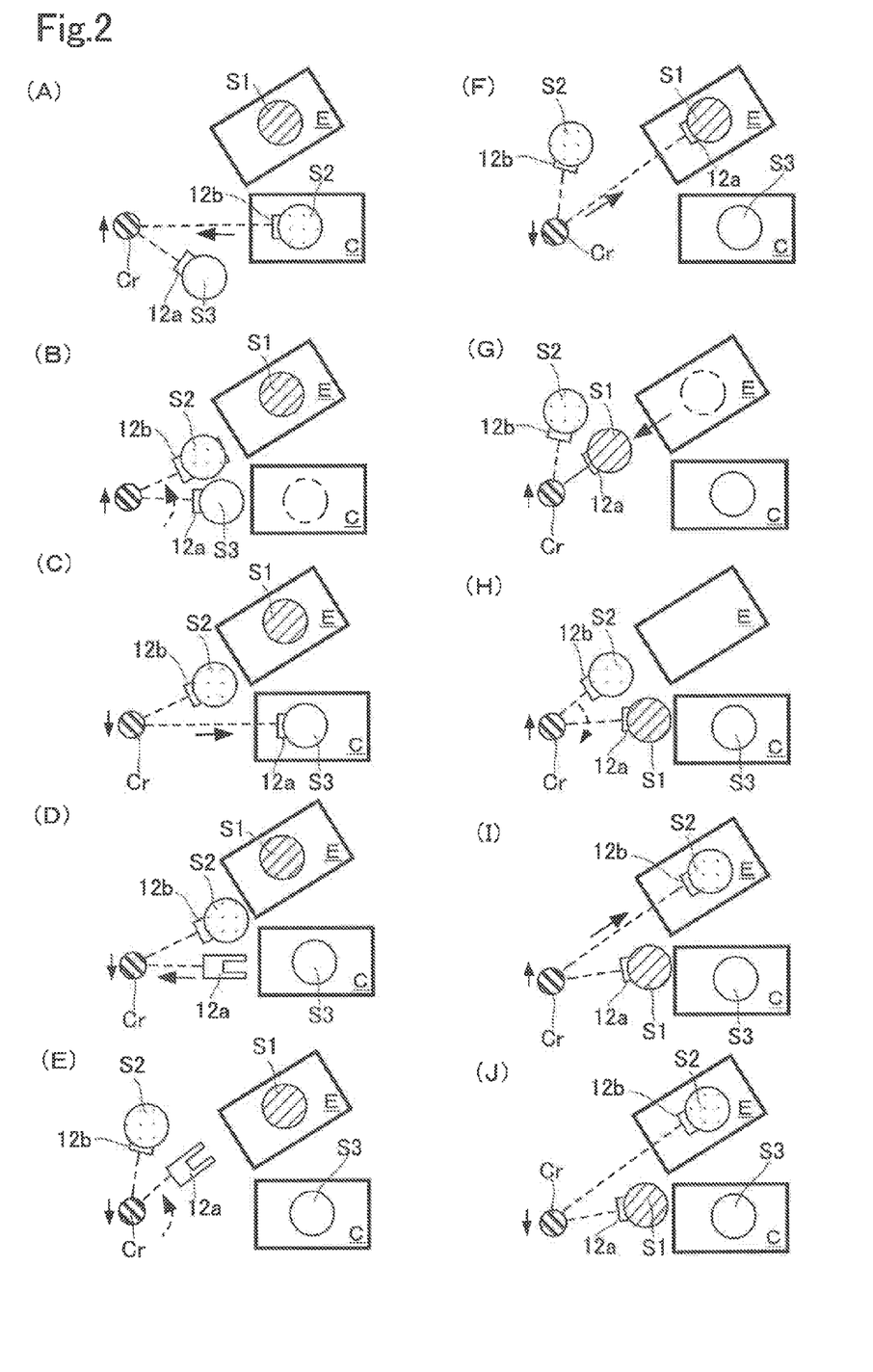
Figure 3:
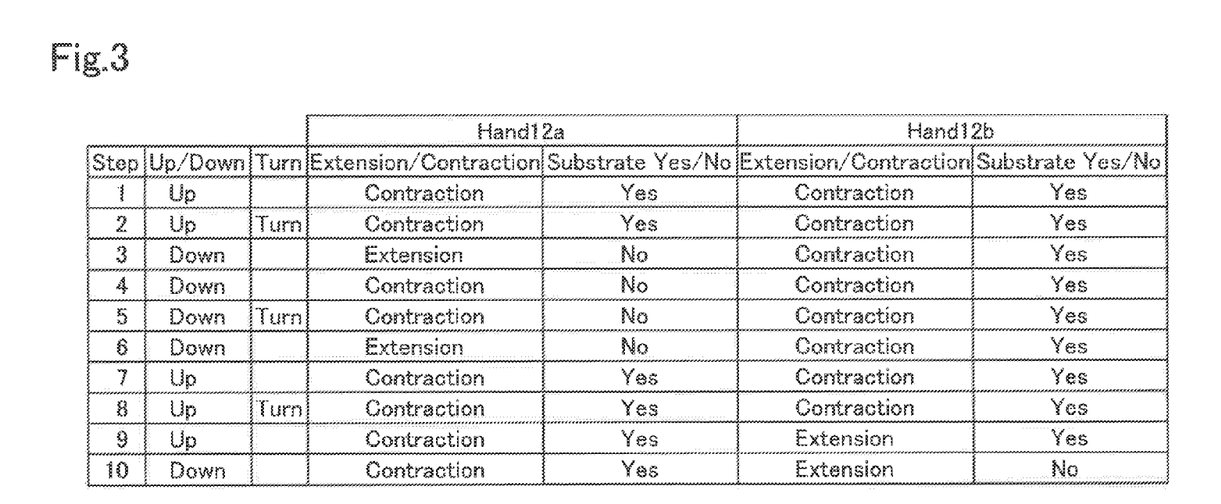
FIG. 3 is a table showing the actions of the transfer robot 1 shown in FIGS. 2(A) through 2(J) for each of the steps.

With reference to FIGS. 2 and 3, a description will now be made of an example in which a series of actions of the transfer robot 1 are performed by a single command at the time of transferring a substrate S2 present in the processing chamber C to a predetermined position of the processing chamber E. FIG. 3 is a table in which the actions of the transfer robot 1 shown in FIGS. 2(A) through 2(J) are summarized for each of the steps.

Here, the substrate 51 shown in FIG. 2 was transferred to the processing chamber C earlier than the substrate S2 and, after having been subjected to the processing in the processing chamber C, was transferred to the processing chamber E. The substrate S2 is the substrate that was transferred to the processing chamber C subsequent to the substrate 51, and was subjected to the processing in the processing chamber C. Substrate S3 is a substrate that has not been processed yet (a to-be-processed substrate) and that is going to be transferred to the processing chamber C after the substrate S2 has been taken out of the processing chamber C. In other words, processing is performed in the processing chamber C in the order of the substrate S1, the substrate S2, and the substrate S3 and, thereafter, the processing is performed thereon in the processing chamber E. By the way, a downward or upward arrow illustrated on the left side of the center of rotation Cr of the motor in FIG. 2 shows the downward movement or the upward movement of the transfer robot 1, respectively.

First, as shown in FIG. 2(A), in a state in which the robot hand 12b is extended to the substrate stage Cs (not illustrated), a single command "exchange" is transmitted from the host computer 4 to the transfer robot 1. The transfer robot 1 that has received the command "exchange" operates to move upward the robot hand 12b so as to support by the robot hand 12b the substrate S2 that has finished the processing in the processing chamber C. Then, the robot hand 12b is contracted to take the substrate S2 out of the processing chamber C (step 1).

Here, it is to be noted that the action for the command "pick" that was employed in the conventional control has already been completed by the above-mentioned step 1, but that a series of actions of the transfer robot 1 corresponding to the above-mentioned command "exchange" have not been completed yet. Therefore, at this point of time, the transfer robot 1 will not generate an action completion signal.

It may be so arranged that the above-mentioned command "exchange" is transmitted from the host computer 4 to the transfer robot 1 in a state in which the front end of the robot hand 12b is directed toward the processing chamber C and also in a contracted state.

Next, in order to place the to-be-processed substrate S3 into the processing chamber C, the robot hand 12a is turned, as shown in FIG. 2(B), such that the front end of the robot hand 12a to support thereon the substrate S3 points to the processing chamber C (step 2). Thereafter, as shown in FIG. 2(C), the robot hand 12a that is supporting the substrate S3 is extended to the substrate stage Cs of the processing chamber C, and the robot hand 12a is lowered (step 3). As a result, the substrate S3 is mounted on the substrate stage Cs in the processing chamber C. Subsequently, as shown in FIG. 2(D), the robot hand 12a is contracted (step 4).

Then, in order to take out the substrate S1 that has finished processing in the processing chamber E, the robot hand 12a is turned so that, as shown in FIG. 2(E), the front end of the robot hand 12a that is not supporting the substrate points to the processing chamber E (step 5).

Subsequently, as shown in FIG. 2(F), the robot hand 12a is extended to the substrate stage Cs of the processing chamber E (step 6). Then, as shown in FIG. 2(G), the robot hand 12a is lifted so that the substrate S1 is supported by the robot hand 12a, and then the robot hand 12a is contracted (step 7). According to this arrangement, the substrate S1 is taken out of the processing chamber E.

Thereafter, in order to place the substrate S2 into the processing chamber E, as shown in FIG. 2(H), the robot hand 12b is turned so that the front end of the robot hand 12b that is supporting the substrate S2 points to the processing chamber E (step 8).

Here, the action of the command "go to" that is used in the conventional control has already been finished in the above-mentioned step 8, but the series of actions of the transfer robot 1 corresponding to the above-mentioned command "exchange" have not been finished yet. Therefore, the transfer robot 1 at this stage has not generated the action completion signal yet.

Then, as shown in FIG. 2(I), the robot hand 12b is extended to the substrate stage Cs in the processing chamber E (step 9). Thereafter, as shown in FIG. 2(J), the robot hand 12b is lowered (step 10). According to this arrangement, the substrate S2 will be placed on the substrate stage Cs in the processing chamber E. As a result of completion of step 10, the series of actions of the transfer robot 1 corresponding to the above-mentioned command "exchange" will be finished. Therefore, the transfer robot 1 will generate an action completion signal and the generated action completion signal is transmitted to the host computer 4.

In this manner, according to this embodiment, a series of actions by the transfer robot 1 at the time of transferring the substrate S2 that is present in the processing chamber C to the substrate stage Cs in the processing chamber E can be performed by a single command of "exchange." When the series of actions of the transfer robot 1 corresponding to this command "exchange" have been completed, the action completion signal is transmitted from the transfer robot 1 to the host computer 4. Therefore, as compared with the case in which these series of actions are performed by a plurality of commands, the number of communications between the transfer robot 1 and the host computer 4 can be reduced, and the time of communication between the transfer robot 1 and the host computer 4 can be largely reduced. The throughput of the processing apparatus can thus be improved.

The above-mentioned series of actions include the swapping action in the processing chamber C, i.e., the action of placing the to-be-processed substrate S3 into the processing chamber C by means of another robot hand after having taken the substrate S2 by the robot hand 12b out of the processing chamber C. It is not always necessary to place the substrate S3 into the processing chamber C. In other words, by performing the series of actions by the transfer robot 1 at the time of transferring the substrate S2 that is present in the processing chamber C to the substrate stage Cs in the processing chamber E, the above-mentioned effects can be materialized.

As described above, the border between the transfer chamber T and each of the processing chambers C through F of the processing apparatus is partitioned by the respective isolation valves 3. Therefore, at the time of extending and contracting the robot hands 12a, 12b, the isolation valves 3 must be opened. On the other hand, after having contracted the robot hands 12a, 12b, the isolation valves 3 must be closed. In particular, even if a to-be-processed substrate is transferred into the processing chambers C through F, the processing on this to-be-processed substrate cannot be started unless the isolation valve 3 is closed.

In the conventional processing apparatus, whenever each of the actions of the robot hand to be performed by a single command is finished, the action completion signal used to be transmitted from the transfer robot to the host computer, or the host computer used to generate the action completion signal. The host computer that has received or generated the action completion signal detects the presence or absence of a substrate on the robot hand by means of the detection means. Based on the detection result, after having confirmed that the transfer has been performed normally, the isolation valve used to be closed.

Figure 4:
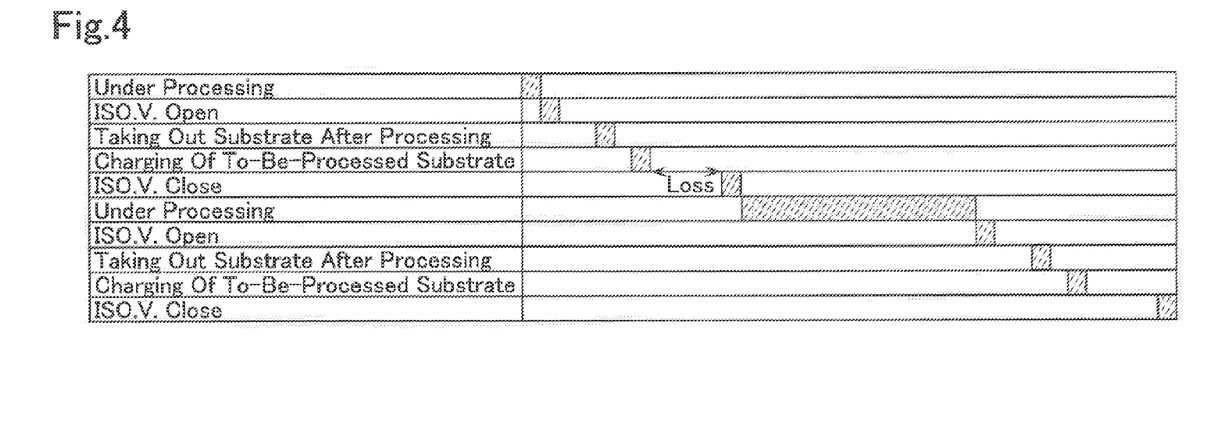
FIG. 4 is a timing chart when an isolation valve is closed subject to the completion of a series of actions.

On the other hand, in this embodiment, a series of actions of the transfer robot 1 are performed by a single command and, until the series of actions are finished, the action completion signal will not be generated. Therefore, when an isolation valve 3 is going to be closed in the same manner as in the conventional method, the presence or absence of the substrate S on the robot hand 12a, 12b cannot be detected until the series of actions have been completed and, therefore, the isolation valve 3 cannot be closed. As a result, as shown in FIG. 4, the time from the insertion, into the processing chamber C through F, of the to-be-processed substrate S to the closing of the isolation valve will be wasted (i.e., there will be time loss), resulting in the possibility of lowering in the throughput of the processing apparatus.

As a solution, in this embodiment, it has been so arranged that the presence or absence of the substrate S on the robot hand 12a, 12b can be detected by the detection means 2 during the series of actions of the transfer robot 1. For example, when the contraction action of the robot hand 12a, 12b is finished, the presence or absence of the substrate S on the robot hand 12a, 12b can be detected. In detail, when the robot hand 12a, 12b has finished the contraction action, there will be generated a signal to show that the transfer robot 1 is in a state in which the presence or absence of the substrate S can be detected based on the signal of an encoder of the motor 10 and the like, i.e., a signal to show that the isolation valve 3 in the processing chamber C through F is in a state of being closable. This generated signal is transmitted to the host computer 4. Alternatively, this signal may be generated by the host computer 4.

The host computer 4 that has received or generated this signal detects the presence or absence of the substrate S on the robot hand 12a, 12b by the detection means 2 without waiting for the completion of the series of actions of the transfer robot 1 and, based on the result of detection, closes the isolation valve 3 between the processing chamber C through F into which the substrate S has been transferred and the transfer chamber T.

Figure 5:
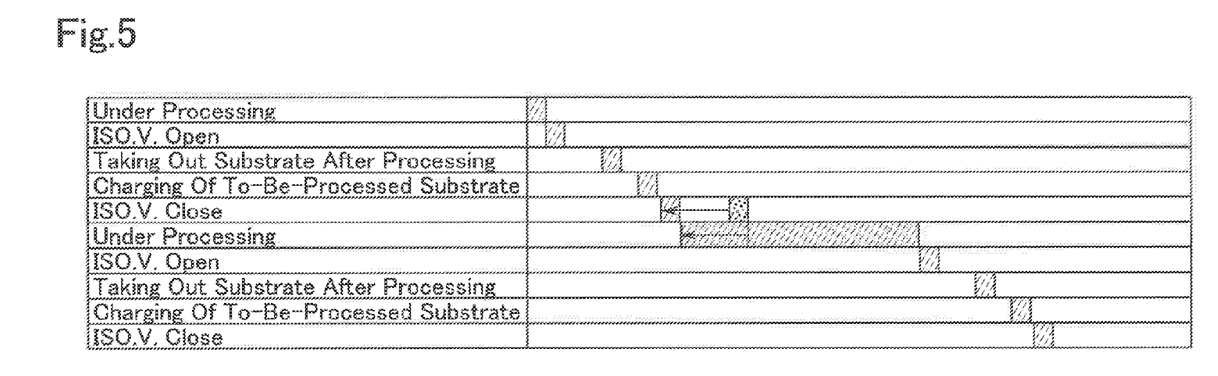
FIG. 5 is a timing chart when the isolation valve is closed without waiting for the completion of a series of actions.

According to this arrangement, the isolation valve 3 can be closed without waiting for the completion of the series of actions of the transfer robot 1. Therefore, the processing can be started earlier inside the processing chamber C through F into which the to-be-processed substrate S has been transported. Consequently, as shown in FIG. 5, there is no time loss from the time at which the to-be-processed substrate S is charged into the processing chamber C through F to the time of closing the isolation valve 3, whereby the throughput can be improved.

Figure 6:
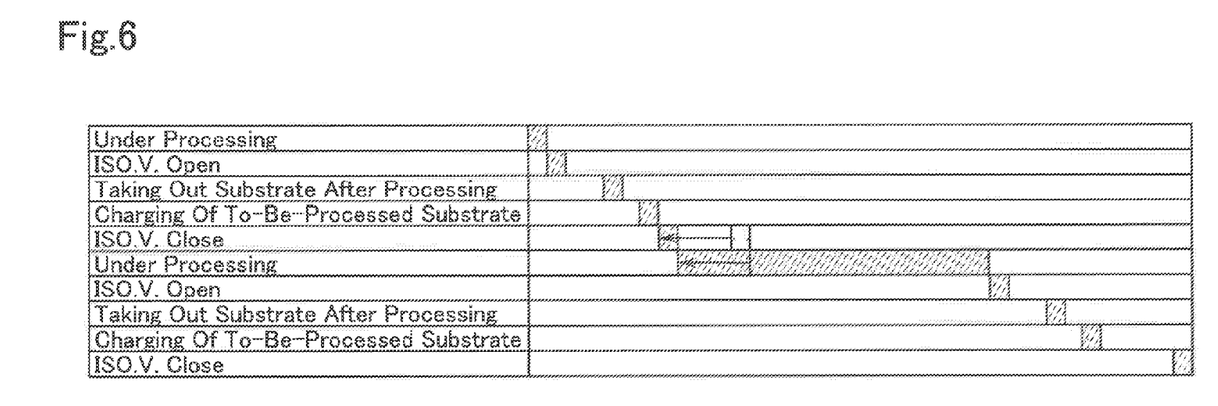
FIG. 6 is a timing chart when the isolation valve is closed without waiting for the completion of a series of actions.

By eliminating the time loss from the time of charging the substrate S to the time of closing the isolation valve 3, the time thus saved may be allocated to the processing time. As a result, as shown in FIG. 6, the processing having a long processing time in the processing chamber C through F can be performed without lowering the throughput.

In this embodiment, at the time of handing over the substrate S between the robot hand 12a, 12b and the substrate stage Cs in the processing chamber C through F, the robot hand 12a, 12b is lifted or lowered. It may alternatively be so arranged that a lift pin disposed in the substrate stage Cs is lifted or lowered.

The parts such as the isolation valve 3, the lift pin, the shield and the like appropriately disposed in the processing chamber C through F are disposed in the transfer passage of the substrate S. They may therefore be obstacles to the transferring of the substrate S. Conventionally, the action of these parts that are disposed in the transfer passage used to be performed at a timing in which each of the actions of the transfer robot is finished. In other words, the parts in the transfer passage used to be acted at a timing in which the action completion signal is generated. As described above, according to this embodiment, there will be generated no action completion signal until the series of actions have been completed. Therefore, the above-mentioned parts may be operated, like in the timing of closing the isolation valve 3, by the time of completion of the series of actions. According to this arrangement, the parts that may be obstacles to the transferring of the substrate S can surely be operated.

Figure 7:
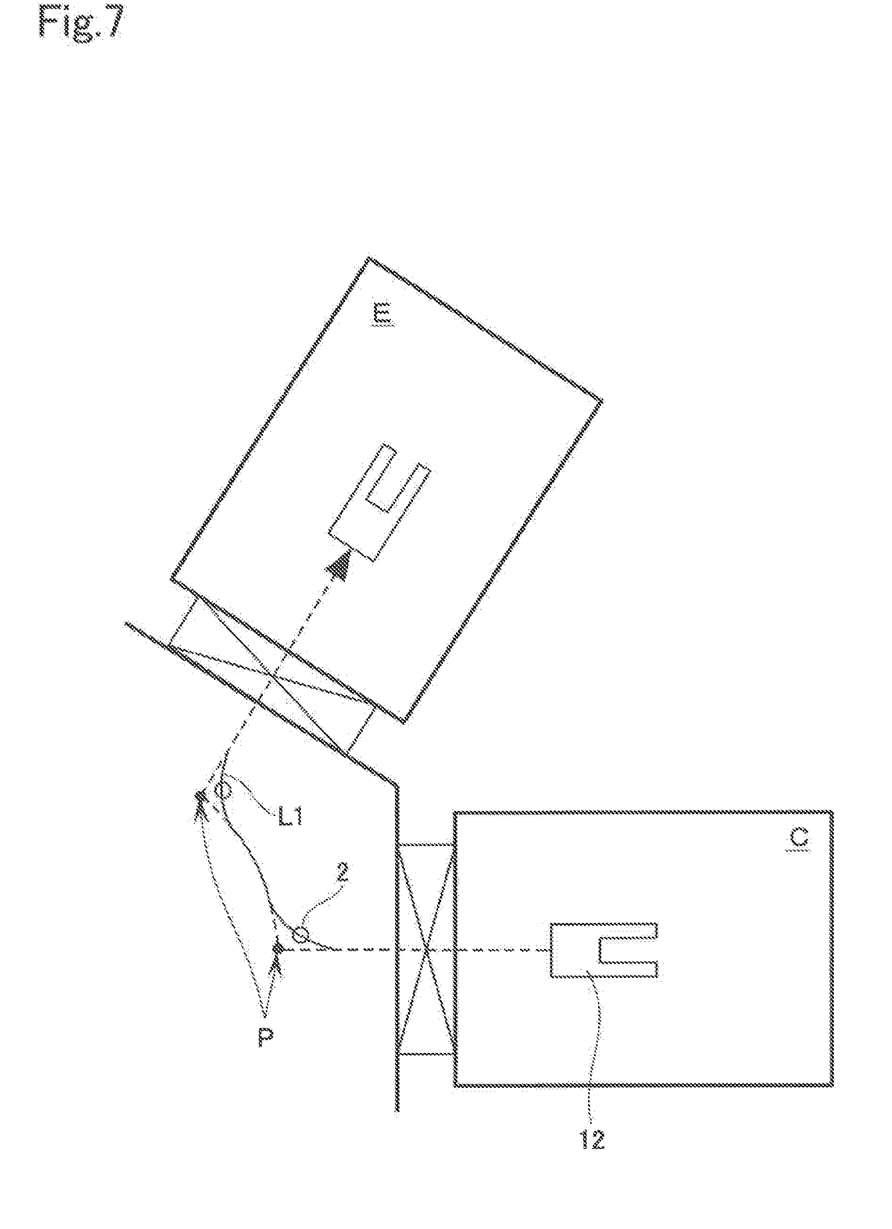
FIG. 7 is a plan view to explain a case in which the transfer robot 1 is controlled so that the telescopic action and the turning action of a robot hand 12 are locally synthesized.

As shown by a solid line L in FIG. 7, the transfer robot 1 may be controlled such that the extension and contraction actions as well as the turning action of the robot hand 12 are locally synthesized in the neighborhood of the switching point P at which the extension and contraction as well as the turning action of the robot hand 12 are switched (or changed over). As a result, the stopping of the transfer robot 1 at the switching point P becomes unnecessary. As compared with the case in which the transfer robot 1 makes a stop at the switching point P, the transfer robot 1 can shorten the time for acceleration and deceleration, thereby shortening the time for transferring. Even in case the transfer robot 1 does not make a stop at the switching point P, the presence or absence of the substrate S on the robot hand 12 during the series of actions of the transfer robot 1 can be detected.

DESCRIPTION OF REFERENCE NUMERALS AND CHARACTERS 1 transfer robot
12 robot hand
3 detection means
S substrate
C, D, E, F processing chamber
P switching (changeover) point

What is claimed is:

1. A method of controlling a transfer robot, the transfer robot transferring a to-be processed substrate from a first of a plurality of processing chambers to a second of the plurality of processing chambers, the method comprising:
contracting a robot hand to take a first substrate out of the first processing chamber;
turning the robot hand so that a front end of the robot hand points to the second processing chamber;
extending the robot hand to transfer the first substrate to the second processing chamber,
wherein a series of actions of the transfer robot including the contracting, turning and extending of the transfer robot hand is performed by a single command,
wherein the transfer robot has two robot hands disposed at a predetermined distance from each other in the turning direction of the transfer robot; the method further comprising: first taking out the first substrate present in the first processing chamber by one of the two robot hands, second taking out, after the first taking out, a second substrate different from the first substrate and handing over by the other of the two robot hands to a predetermined position in the first processing chamber, wherein the series of actions further includes the first taking out and the second taking out and handing; and the method further comprising: during the series of actions without waiting for completion of the series of actions, generating a signal for closing an isolation valve which separates the first processing chamber from a transfer chamber in which the transfer robot is disposed,
wherein the transfer robot generates the signal.

2. The method of controlling a transfer robot according to claim 1, wherein the contracting, extending and the turning of the transfer robot are locally synthesized before and after a switching point at which the contracting, extending, and the turning of the transfer robot are switched to each other.

3. The method of controlling a transfer robot according to claim 2, wherein the presence or absence of a substrate on the robot hand is detected during a series of actions of the transfer robot and, based on results of the detection, operation is made of parts disposed in a transfer passage that lies in transferring the substrate present in the first processing chamber to the second processing chamber.

4. The method of controlling a transfer robot according to claim 3, wherein the parts include at least one of
- an isolation valve which separates each of the plurality of the processing chambers from a transfer chamber in which the transfer robot is disposed,
- a lift pin which is moved up and down when a substrate is handed over between the transfer robot and a substrate stage disposed in the each of the plurality of the processing chambers, and
- a shield which forms a protection wall in the each of the plurality of the processing chambers.

5. The method of controlling a transfer robot according to claim 2, wherein the parts include at least one of
- an isolation valve which separates each of the plurality of the processing chambers from a transfer chamber in which the transfer robot is disposed,
- a lift pin which is moved up and down when a substrate is handed over between the transfer robot and a substrate stage disposed in the each of the plurality of the processing chambers, and
- a shield which forms a protection wall in the each of the plurality of the processing chambers.

6. The method of controlling a transfer robot according to claim 1, wherein the presence or absence of a substrate on the robot hand is detected during the series of actions of the transfer robot and, based on results of the detection, operation is made of parts disposed in a transfer passage that lies in transferring the substrate present in the first processing chamber to the second processing chamber.

7. The method of controlling a transfer robot according to claim 6, wherein the parts include at least one of
- an isolation valve which separates each of the plurality of the processing chambers from a transfer chamber in which the transfer robot is disposed,
- a lift pin which is moved up and down when a substrate is handed over between the transfer robot and a substrate stage disposed in the each of the plurality of the processing chambers, and
- a shield which forms a protection wall in the each of the plurality of the processing chambers.

8. The method of controlling a transfer robot according to claim 1, wherein the parts include at least one of
- an isolation valve which separates each of the plurality of the processing chambers from a transfer chamber in which the transfer robot is disposed,
- a lift pin which is moved up and down when a substrate is handed over between the transfer robot and a substrate stage disposed in the each of the plurality of the processing chambers, and
- a shield which forms a protection wall in the each of the plurality of the processing chambers.

* * * * *